United States Patent
Rathi

(10) Patent No.: US 9,076,449 B2
(45) Date of Patent: Jul. 7, 2015

(54) MULTISTAGE IIR FILTER AND PARALLELIZED FILTERING OF DATA WITH SAME

(71) Applicant: Dolby Laboratories Licensing Corporation, San Francisco, CA (US)

(72) Inventor: Khushbu P. Rathi, Foster City, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 14/058,498

(22) Filed: Oct. 21, 2013

(65) Prior Publication Data

US 2014/0046673 A1 Feb. 13, 2014

Related U.S. Application Data

(63) Continuation of application No. PCT/US2013/036932, filed on Apr. 17, 2013.

(60) Provisional application No. 61/645,291, filed on May 10, 2012.

(51) Int. Cl.
*G10L 19/00* (2013.01)
*G10L 19/26* (2013.01)
*H03H 17/04* (2006.01)

(52) U.S. Cl.
CPC .............. *G10L 19/26* (2013.01); *H03H 17/04* (2013.01)

(58) Field of Classification Search
USPC ............... 704/500–504, 200, 220, 227, 228, 704/206–207; 708/320, 300
See application file for complete search history.

(56) References Cited

U.S. PATENT DOCUMENTS

| | | | |
|---|---|---|---|
| 5,583,962 A | 12/1996 | Davis et al. | 395/2.38 |
| 5,632,005 A | 5/1997 | Davis et al. | 395/2.95 |
| 5,633,981 A | 5/1997 | Davis | 395/2.39 |
| 5,727,119 A | 3/1998 | Davidson et al. | 395/2.12 |
| 6,021,386 A | 2/2000 | Davis | 704/229 |
| 6,873,280 B2 | 3/2005 | Robinson et al. | 341/159 |
| 7,152,084 B2 | 12/2006 | Gagnon | 708/301 |
| 7,159,002 B2* | 1/2007 | Gurrapu | 708/320 |
| 7,290,021 B2 | 10/2007 | Gray | 708/300 |
| 7,411,444 B2 | 8/2008 | Muhammad | 327/552 |

(Continued)

OTHER PUBLICATIONS

Flexible Perceptual Coding for Audio Transmission and Storage, by Craig C. Todd, et al *96th Convention of the Audio Engineering Society*, Feb. 26, 1994, Preprint 3796.

(Continued)

*Primary Examiner* — Huyen Vo

(57) ABSTRACT

In some embodiments, a multistage filter whose biquad filter stages are combined with latency between the stages, a system (e.g., an audio encoder or decoder) including such a filter, and methods for multistage biquad filtering. In typical embodiments, all biquad filter stages of the filter are operable independently to perform fully parallelized processing of data. In some embodiments, the inventive multistage filter includes a buffer memory, at least two biquad filter stages, and a controller coupled and configured to assert a single stream of instructions to the filter stages. Typically, the multistage filter is configured to perform multistage filtering of a block of input samples in a single processing loop with iteration over a sample index but without iteration over a biquadratic filter stage index.

15 Claims, 7 Drawing Sheets

(56) References Cited

U.S. PATENT DOCUMENTS

| | | | |
|---|---|---|---|
| 7,421,050 B2 | 9/2008 | Aziz | 375/355 |
| 7,747,666 B2 | 6/2010 | Haddadin | 708/313 |
| 7,933,341 B2 | 4/2011 | Agazzi | 375/260 |
| 2002/0049799 A1 | 4/2002 | Wang | 708/320 |
| 2002/0138716 A1 | 9/2002 | Master et al. | |
| 2011/0216862 A1 | 9/2011 | Bogdan | 375/371 |
| 2012/0019723 A1 | 1/2012 | McGrath | 348/571 |

OTHER PUBLICATIONS

"Design and Implementation of AC-3 Coders," by Steve Vernon, *IEEE Trans. Consumer Electronics*, vol. 41, No. 3, Aug. 1995, pp. 754-759.

"Dolby Digital Audio Coding Standards," book chapter by Robert L. Andersen and Grant Davidson, in *The Digital Signal Processing Handbook*, Second Edition, Vijay K. Madisett Editor-in-Chief, CRC Press, 2009.

"High Quality, Low-Rate Audio Transform Coding for Transmission and Multimedia Applications," by Bosi et al, Audio Engineering Society Preprint 3365, 93rd AES Convent Oct. 1992.

Fielder, L.D. et al., "Introduction to Dolby Digital Plus, an Enhancement to the Dolby Digi Coding System," AES Convention Paper 6196, 117$^{th}$ AES Convention, Oct. 28, 2004.

Digital Audio Compression Standard (AC-3, E-AC-3) Specification (ATSC A/52:2010), Nov. 22, 2010.

PCT International Search Report of International Application TW Patent Application No. 102113501 filed on Apr. 16, 2013 in the name of Dolby Laboratories Licensing Corporation with translation. 12 Pages.

\* cited by examiner

MULTISTAGE IIR FILTER AND PARALLELIZED FILTERING OF DATA WITH SAME

CROSS-REFERENCE TO RELATED APPLICATIONS

The present application is a continuation of and claims the benefit of the filing date of the following PCT International application which designates the United States: PCT International Application No. PCT/US2013/036932, filed Apr. 17, 2013 (International Filing Date), entitled "Multistage IIR Filter and Parallelized Filtering of Data with Same," which claims the benefit of the filing date of U.S. Provisional Patent Application No. 61/645,291, filed May 10, 2012. The present application also claims the benefit of the filing date of U.S. Provisional Patent Application No. 61/645,291, filed May 10, 2012, which is hereby incorporated by reference in its entirety.

BACKGROUND OF THE INVENTION

1. Field of the Invention

The invention pertains to multistage filters comprising biquadratic filter stages, and to parallelized filtering of data (e.g., audio data) using such filters. Some embodiments of the invention are methods, systems, and processors for filtering audio data (using a multistage filter comprising biquadratic filter stages) during encoding or decoding of the data in accordance with one of the formats known as Dolby Digital (AC-3), Dolby Digital Plus (E-AC-3), and Dolby E, or in accordance with another encoding format. Dolby, Dolby Digital, Dolby Digital Plus, and Dolby E are trademarks of Dolby Laboratories Licensing Corporation.

2. Background of the Invention

Throughout this disclosure, including in the claims, the expression performing an operation "on" signals or data (e.g., filtering or scaling the signals or data) is used in a broad sense to denote performing the operation directly on the signals or data, or on processed versions of the signals or data (e.g., on versions of the signals that have undergone preliminary filtering or other processing prior to performance of the operation thereon).

In signal processing, a digital biquadratic filter is a second-order recursive linear filter, containing two poles and two zeros. The abbreviation "biquad" (or "bi-quad") filter will be used herein to denote a digital biquadratic filter. In the Z domain, the transfer function of a biquad filter is the ratio of two quadratic functions:

$$H(z) = \frac{b_0 + b_1 z^{-1} + b_2 z^{-2}}{1 + a_1 z^{-1} + a_2 z^{-2}}$$

High-order recursive filters (infinite impulse response or "IIR" filters of order greater than second order) can be highly sensitive to quantization of their coefficients, and can easily become unstable. First and second-order recursive filters can also have instability problems of this type but the instability problems are much less severe. Therefore, high-order recursive filters are typically implemented as serially cascaded filters comprising a serial cascade of bi-quad sections (and optionally also a first-order filter). Such serially cascaded filters are sometimes referred to herein as multistage biquad filters, and comprise a sequence of bi-quad filters (sometimes referred to herein as bi-quad stages or bi-quad sections).

For example, conventional encoders configured to encode audio data in accordance with the well known AC-3 (Dolby Digital) format, or either of the well known Dolby Digital Plus and Dolby E formats, implement a number of multistage biquad filters. For example, a Dolby Digital Plus encoder typically employs a two-stage biquad filter (i.e., a filter including two cascaded biquad filters) to implement high pass filtering in a transient detector subsystem, a four-stage biquad filter (i.e., a filter including four cascaded biquad filters) to implement low pass filtering in a low frequency effects ("LFE") subsystem, and a three-stage biquad filter to implement bandwidth limiting low pass filtering. A Dolby E encoder typically employs a two-stage biquad filter (i.e., a filter including two cascaded biquad filters) to implement high pass filtering in a transient detector subsystem, and a four-stage biquad filter (i.e., a filter including four cascaded biquad filters) to implement low pass filtering in a low frequency effects ("LFE") subsystem. A Dolby E decoder typically employs a three-stage biquad filter (i.e., a filter including three cascaded biquad filters) to implement low pass filtering in a low frequency effects ("LFE") subsystem.

For example, FIG. 1 is a diagram of a biquad filter (of a type sometimes referred to as Direct Form II—Transposed structure), including elements 1, 2, 3, 4, 5, $b_0$, $b_1$, $b_2$, $-a_1$, and $-a_2$, connected as shown. Elements 1, 2, and 3 are addition elements, elements 4 and 5 are delay elements, and each of gain elements $b_0$, $b_1$, $b_2$, $-a_1$, and $-a_2$ applies a corresponding one of gains $b_0$, $b_1$, $b_2$, $-a_1$, and $-a_2$, to the signal asserted to its input. Although not shown or described herein, it is well known to those skilled in the art that other, equivalent, biquad filter structures exist, for example Direct Form I, Direct Form I—Transposed, and Direct Form II. Any such equivalent biquad filter structures are within the scope of the invention.

As shown in FIG. 1A, if the biquad filter of FIG. 1 (labeled as Biquad 1 in FIG. 1A) is cascaded with a biquad filter having identical structure (labeled as Biquad 2 in FIG. 1A) but whose gain elements may apply different gains than do those of the FIG. 1 filter, the resulting multistage biquad filter is an example of a two-stage biquad filter that can be employed (e.g., to implement high pass filtering in a transient detector subsystem of an audio encoder as mentioned above). In the multistage biquad filter of FIG. 1A, the output signal, x1(n), of the first stage is the input signal to the second stage.

For multistage biquad filters (and some other multistage IIR filters), an output sample calculation in each stage at instant "n" (i.e., the stage's output signal y(n)) in response to values of a time-domain signal x(n) (an input signal or a signal generated in another stage of the multistage filter) at instant "n" and previous instants, has dependency on previous outputs (i.e., the outputs y(n−1) and y(n−2), at instants n−1 and n−2). Also, for each two consecutive stages (biquad filters) in a multistage biquad filter, the output of each earlier stage is input to the subsequent stage, so that the output of subsequent stage cannot be determined until after the output of the earlier stage has been determined. These are main reasons as to why fully parallelized processing has not been employed (before the present invention) to implement a multistage biquad filter.

In many modern day core processor architectures (e.g., digital signal processor architectures) there are SIMD (single instruction, multiple data) units and/or multiple ALUs (arithmetic logic units) or AMUs (arithmetic manipulation units) which can be used to parallelize many algorithms and improve performance. However, conventional algorithms for programming processors to implement multistage biquad filters do not use SIMD instructions and are not parallelized.

For example, Dolby Digital Plus encoders (which encode audio data in accordance with the Dolby Digital Plus format) have been implemented as programmed ARM neon processors (each of which is an ARM Cortex processor with a Neon SIMD engine allowing parallel processing), and as programmed Texas Instruments C64 digital signal processors. Many audio data encoders (e.g., encoders which encode audio data in accordance with the AC-3, Dolby Digital Plus, Dolby E, and/or other encoding formats) have been or could be implemented as programmed processors having any of a variety of architectures, having SIMD (single instruction, multiple data) units and/or multiple ALUs (arithmetic logic units) or AMUs (arithmetic manipulation units). Such processors could be programmed to implement various algorithms (included in the audio data encoding) using parallel processing. However, the conventional programming that has been employed to implement multistage biquad filters in such processors has not implemented parallel processing.

Typical embodiments of the present invention employ parallel processing to implement a multistage biquad filter. Some embodiments employ parallel processing to implement a multistage biquad filter of a type used in encoding audio data in accordance with the AC-3 (Dolby Digital) format, the Dolby Digital Plus format, or the Dolby E format.

Although the invention is not limited to use in encoding audio data in accordance with the AC-3, Dolby Digital Plus, or Dolby E format, some embodiments are audio encoding methods, systems, and processors (e.g., for encoding audio data in accordance with the AC-3, Dolby Digital Plus, or Dolby E format) employing at least one multistage biquad filter implementing (or designed in accordance with) an embodiment of the invention.

An AC-3 encoded bitstream comprises one to six channels of audio content, and metadata indicative of at least one characteristic of the audio content. The audio content is audio data that has been compressed using perceptual audio coding.

Details of AC-3 (also known as Dolby Digital) coding are well known and are set forth in many published references including the following:

ATSC Standard A52/A: Digital Audio Compression Standard (AC-3), Revision A, Advanced Television Systems Committee, 20 Aug. 2001;

Flexible Perceptual Coding for Audio Transmission and Storage," by Craig C. Todd, et al, 96$^{th}$ Convention of the Audio Engineering Society, Feb. 26, 1994, Preprint 3796;

"Design and Implementation of AC-3 Coders," by Steve Vernon, IEEE Trans. Consumer Electronics, Vol. 41, No. 3, August 1995;

"Dolby Digital Audio Coding Standards," book chapter by Robert L. Andersen and Grant A. Davidson in The Digital Signal Processing Handbook, Second Edition, Vijay K. Madisetti, Editor-in-Chief, CRC Press, 2009;

"High Quality, Low-Rate Audio Transform Coding for Transmission and Multimedia Applications," by Bosi et al, Audio Engineering Society Preprint 3365, 93rd AES Convention, October, 1992; and U.S. Pat. Nos. 5,583,962; 5,632,005; 5,633,981; 5,727,119; and 6,021,386.

Details of Dolby Digital (AC-3) and Dolby Digital Plus (sometimes referred to as Enhanced AC-3 or "E-AC-3") coding are set forth in "Introduction to Dolby Digital Plus, an Enhancement to the Dolby Digital Coding System," AES Convention Paper 6196, 117$^{th}$ AES Convention, Oct. 28, 2004, and in the Dolby Digital/Dolby Digital Plus Specification (ATSC A/52:2010), available at http://www.atsc.org/cms/index.php/standards/published-standards.

BRIEF DESCRIPTION OF THE INVENTION

In a class of embodiments, the invention is a multistage filter comprising at least two stages (each of which is a biquad filter), wherein the stages are combined with latency between said stages, such that all the stages are operable independently in response to a single, common stream of instructions, to perform fully parallelized processing of data in said stages. Typically, the multistage filter also includes a controller coupled to assert the common stream of instructions to all the stages, and a data memory coupled to all the stages, and all the stages are operable in parallel to filter a block of input data values in response to the common stream of instructions, but with each of the stages operating on different data values, and with at least one of the stages operating on data values which include buffered values, generated by another one of the stages in response to a subset of the input data values and stored with different latencies in the memory before being retrieved for processing in said one of the stages. Thus, the multistage filter in these embodiments has a SIMD (single instruction, multiple data) architecture in which the individual biquad filter stages operate independently and in parallel in response to the single stream of instructions. For example, the multistage filter may include N stages (where N is a number greater than one), and one of the stages (the "M+1"th stage in the sequence) may operate on data values generated by a previous one of the stages (the "M"th stage in the sequence) at different times (e.g., in response to a sequence of different input data values of the block), stored in a buffer memory (at different times), and read (by the "(M+1)"th stage) from the buffer memory after residing in the buffer memory with different latency times.

In some embodiments, the invention is a multistage filter, including:

a buffer memory;

at least two biquad filter stages, including a first biquad filter stage and a subsequent biquad filter stage; and a controller, coupled to the biquad filter stages and configured to assert a single stream of instructions to both the first biquad filter stage and the subsequent biquad filter stage, wherein said first biquad filter stage and said subsequent biquad filter stage operate independently and in parallel in response to the stream of instructions, wherein the first biquad filter stage is coupled to the memory and configured to perform biquadratic filtering on a block of N input samples in response to the stream of instructions to generate intermediate values, and to assert the intermediate values to the memory (for storage in said memory), wherein the intermediate values include a filtered version of each of at least a subset of the input samples, and wherein the subsequent biquad filter stage is coupled to the memory and configured to perform biquadratic filtering on buffered values retrieved from the memory in response to the stream of instructions to generate a block of output values, wherein the output values include an output value corresponding to each of the input samples in the block of N input samples, and the buffered values include at least some of the intermediate values generated in the first biquad filter stage in response to the block of N input samples.

In typical embodiments, the multistage filter is configured to perform multistage filtering of the block of N input samples in a single processing loop with iteration over a sample index but without iteration over a biquadratic filter stage index.

In some embodiments of the inventive multistage filter in which the multistage filter has M stages, the subsequent biquad filter stage is configured to generate an output value corresponding to a "j"th one of the input samples in response to a subset of the buffered values retrieved from the memory, where j is an index in the range from M−1 to N−1, said subset including the filtered version of the "j"th one of the input samples, the filtered version of a "j−1"th one of the input samples, and the filtered version of a "j−2"th one of the input samples.

In some embodiments of the inventive multistage filter, the subsequent biquad filter stage is configured to generate an output value corresponding to each of the input samples in response to a different subset of the buffered values retrieved from the memory, each said subset includes at least three of the intermediate values generated in the first biquad filter stage and retrieved from the memory after residing in said memory for different latency times. For example, in a typical embodiment in which the multistage filter has M biquad filter stages, the subset of the buffered values retrieved to generate the output value corresponding to a "j"th one of the input samples, where j is an index in the range from M−1 to N−1, includes at least one value generated in the first biquad filter stage in response to the "j"th one of the input samples, at least one value generated in the first biquad filter stage in response to the "j−1"th one of the input samples, and at least one value generated in the first biquad filter stage in response to the "j−2"th one of the input samples.

In another class of embodiments, the invention is a method for performing multistage filtering on a block of N input samples, said method including the steps of:

(a) performing a first biquadratic filtering operation on the block of N input samples to generate intermediate values, and asserting the intermediate values to a buffer memory (for storage in said memory), wherein the intermediate values include a filtered version of each of at least a subset of the input samples; and (b) performing a second biquadratic filtering operation on buffered values retrieved from the memory, to generate a block of output values, wherein the output values include an output value corresponding to each of the input samples in the block of N input samples, a different subset of the buffered values is retrieved and filtered to generate the output value corresponding to each of the input samples in the block, and each said subset of the buffered values includes at least two (e.g., three) of the intermediate values generated during performance of step (a) which are retrieved from the memory after residing in said memory for different latency times, wherein steps (a) and (b) are performed in response to a single stream of instructions, such that steps (a) and (b) are performed independently and in parallel in response to the single stream of instructions. In typical embodiments, the multistage filtering of the block of input samples is performed in a single loop with iteration over a sample index but without iteration over a biquadratic filter stage index.

In some embodiments of the inventive method in which the filtering is performed in a multistage filter having M stages, the buffered values retrieved in step (b) to generate the output value corresponding to the "j"th one of the input samples, where j is an index in the range from M−1 to N−1, include the filtered version of the "j"th one of the input samples generated in step (a), the filtered version of a "j−1"th one of the input samples generated in step (a), and the filtered version of a "j−2"th one of the input samples generated in step (a).

In another class of embodiments, the invention is an audio encoder configured to generate encoded audio data in response to input audio data, said encoder including at least one multistage filter (which is any embodiment of the inventive multistage filter) coupled and configured to filter the audio data (e.g., to filter a preliminarily processed version of the audio data). In another class of embodiments, the invention is a method for encoding audio data to generate encoded audio data, including by performing any embodiment of the inventive multistage biquad filtering method on the audio data (e.g., on a preliminarily processed version of the audio data). For example, an embodiment of the invention is an audio encoder including a pre-processing stage (for preliminary processing of input audio data to be encoded by the encoder), wherein the pre-processing stage includes at least one multistage filter (which is any embodiment of the inventive multistage filter) coupled and configured to filter the audio data (e.g., the input data or a preliminarily processed version of the input data). Another embodiment of the invention is a pre-processor (for performing preliminary processing of audio data to be encoded by an encoder), wherein the pre-processor includes at least one multistage filter (which is any embodiment of the inventive multistage filter) coupled and configured to filter the audio data (e.g., data that is input to the pre-processor or a preliminarily processed version of such input data).

In another class of embodiments, the invention is an audio decoder configured to generate decoded audio data in response to encoded audio data. In some embodiments in this class, the decoder includes at least one multistage filter (which is any embodiment of the inventive multistage filter) coupled and configured to filter the encoded audio data (e.g., to filter a preliminarily processed version of the encoded audio data). In another class of embodiments, the invention is a method for decoding encoded audio data to generate decoded audio data. In some such embodiments, the decoding includes performance of any embodiment of the inventive multistage biquad filtering method on the encoded audio data (e.g., on a preliminarily processed version of the encoded audio data). For example, an embodiment of the invention is an audio decoder including a post-processing stage (for post-processing of decoded audio data that has been decoded by the decoder), wherein the post-processing stage includes at least one multistage filter (which is any embodiment of the inventive multistage filter) coupled and configured to filter audio data (e.g., the decoded data or a processed version of the decoded data). Another embodiment of the invention is a post-processor (e.g., for performing post-processing of decoded audio data that has been decoded by an decoder), wherein the post-processor includes at least one multistage filter (which is any embodiment of the inventive multistage filter) coupled and configured to filter audio data (e.g., decoded data that is input to the post-processor or a processed version of such input data).

In accordance with typical embodiments of the present invention, SIMD instructions (or instructions for parallel processing by multiple ALUs or AMUs) are used to program a processor (e.g., a digital signal processor or general purpose processor) to implement a multistage filter. The multistage filter may implement bandwidth filtering, low pass filtering (e.g., in an LFE subsystem of an audio encoder), high pass filtering (e.g., in a transient detector subsystem of an audio encoder), or other filtering.

Other aspects of the invention include a system or device (e.g., an encoder, a decoder, or a processor) configured (e.g., programmed) to perform any embodiment of the inventive method, and a computer readable medium (e.g., a disc) which stores code for implementing any embodiment of the inventive method or steps thereof. For example, the inventive system can be or include a programmable general purpose processor, digital signal processor, or microprocessor, programmed with software or firmware and/or otherwise configured to perform any of a variety of operations on data, including an embodiment of the inventive method or steps thereof. Such a general purpose processor may be or include a computer system including an input device, a memory, and processing circuitry programmed (and/or otherwise configured) to perform an embodiment of the inventive method (or steps thereof) in response to data asserted thereto.

Some embodiments of the invention are encoders (e.g., encoders which encode audio data in accordance with the Dolby Digital Plus, AC-3, or Dolby E format) or decoders, implemented as programmed processors (e.g., ARM neon processors, each of which is an ARM Cortex processor with a Neon SIMD engine allowing parallel processing, or other processors having SIMD (single instruction, multiple data) units and/or multiple ALUs (arithmetic logic units) or AMUs (arithmetic manipulation units)) or programmed (and/or otherwise configured) digital signal processors (e.g., DSPs having SIMD units and/or multiple ALUs or AMUs).

BRIEF DESCRIPTION OF THE DRAWINGS

In FIG. 4, memory 10 includes memory locations which store each block of input data x(n), and buffer memory locations which store all required ones of the intermediate values $x_1(n), \ldots, x_{N-1}(n)$ generated by the biquad filters.

DETAILED DESCRIPTION OF EMBODIMENTS OF THE INVENTION

Embodiments of the inventive method and systems (e.g., encoders and decoders) configured to implement the inventive method will be described with reference to FIGS. 3, 4, 5, 6, 7, and 8.

First, with reference to FIG. 2, we describe a conventional method for filtering data samples (e.g., blocks of audio data samples) with a multistage filter comprising a cascade of M biquad filters (where M is a number that is referred to as "nsections" below and in FIG. 2). An example of such a conventional multistage biquad filter is the filter of above-described FIG. 1A.

Figure 2:
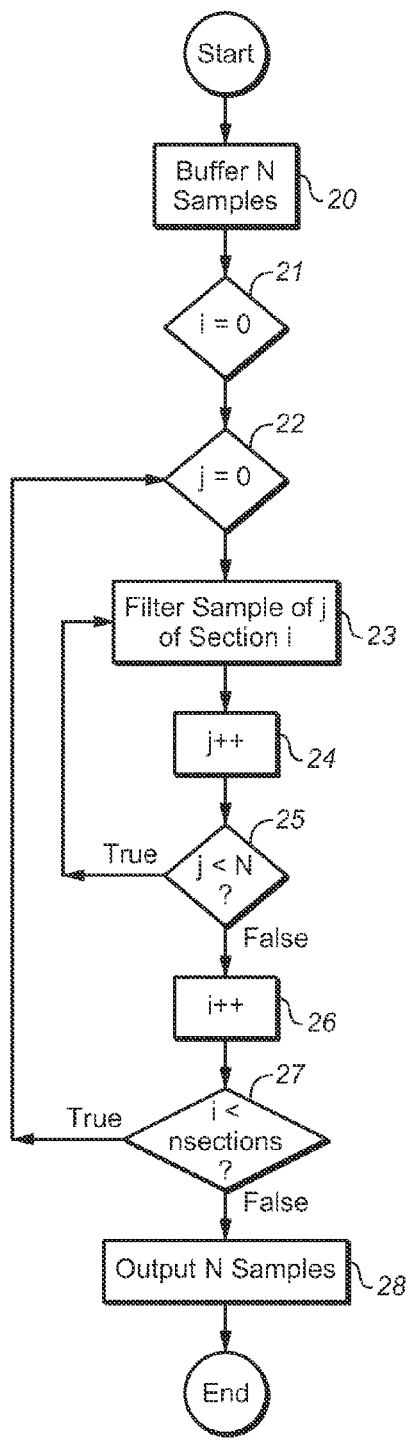
FIG. 2 is a flow chart of a conventional method for performing filtering in a filter implemented as serially-cascaded biquad filters ("cascaded biquad sections").

In the method of FIG. 2, each new block of N samples to be filtered is initially buffered (in step 20). Each sample in a block is identified by index j, where $0 \leq j \leq N-1$. Each stage (section) in the multistage filter is identified by index i, where $0 \leq i \leq M-1$.

In step 21, index i is initialized to zero, and in step 22, index j is initialized to zero.

In step 23, the "j"th input sample is filtered in the "i"th biquad filter, and then, in step 24, the index j is incremented. Step 25 determines whether the incremented index j (equal to j+1) is less than N. If it is determined in step 25 that the incremented index j is less than N, step 23 is again performed to filter the next ("(j+1)"th) sample in the "i"th biquad filter.

If it is determined in step 25 that the incremented index j is equal to N (so that all samples in the current block have been filtered in the current biquad filter, then, in step 26, the index i is incremented.

Step 27 determines whether the most recently incremented index i (equal to i+1) is less than the number "nsections" (which is equal to M). If it is determined in step 27 that the most recently incremented index i is less than M, another iteration of steps 22-26 is then performed to filter the latest block of intermediate values (the outputs of the previous ("i"th) biquad filter, generated in the previous biquad filter in the previous iteration of steps 22-25) in the next (("(i+1)"th) biquad filter.

If it is determined in step 27 that the most recently incremented index i is equal to M, so that processing of all samples in the current block in all the biquad filters is complete, then step 28 is performed. In step 28, the N filtered samples generated by filtering the current block of input samples in the multistage filter are output. At this point, any additional block of N samples to be filtered is buffered (in a new performance of step 20) and the FIG. 2 method is repeated to filter the new block of samples in the multistage filter.

For the FIG. 2 process, in the case that M=2 (i.e., in the case that the multistage filter comprises only two cascaded biquad filters), the processing performed in each stage of the multistage filter is also described by the following pseudocode, in which N=the number of output samples to be generated by filtering a block of N samples in the multistage filter:

```
for (i = 0; i < 2; i++)
{
    for (j = 0; j < N; j++)
    {
        Output[j]= function ( output[j−1], output[j−2], input[j] , input[j−1],
            input[j−2] );
    }
}
```

During performance of the conventional FIG. 2 method, since the output of each stage of the multistage filter for each sample ("output[j]") depends, in general, on the outputs of the stage for the two previous samples (output[j−1] and output [j−2]), and on the current input to the stage ("input[j]") and the two previous inputs to the stage (input[j−1] and input[j−2]), the operations for the loop (steps 23, 24, and 25 of FIG. 2) implemented within the stage are not parallelized. Also, since the output of the first stage (i=0) is input to the second stage (i=1), operations across the stages are not parallelized in performance of the conventional FIG. 2 method. This leads to a high instruction count (sometimes referred to as MIPS or Millions of Instructions Per Second) requirement for the multistage filter even when it is implemented by a processor whose architecture includes multiple ALUs (or AMUs) or SIMD units.

Figure 3:
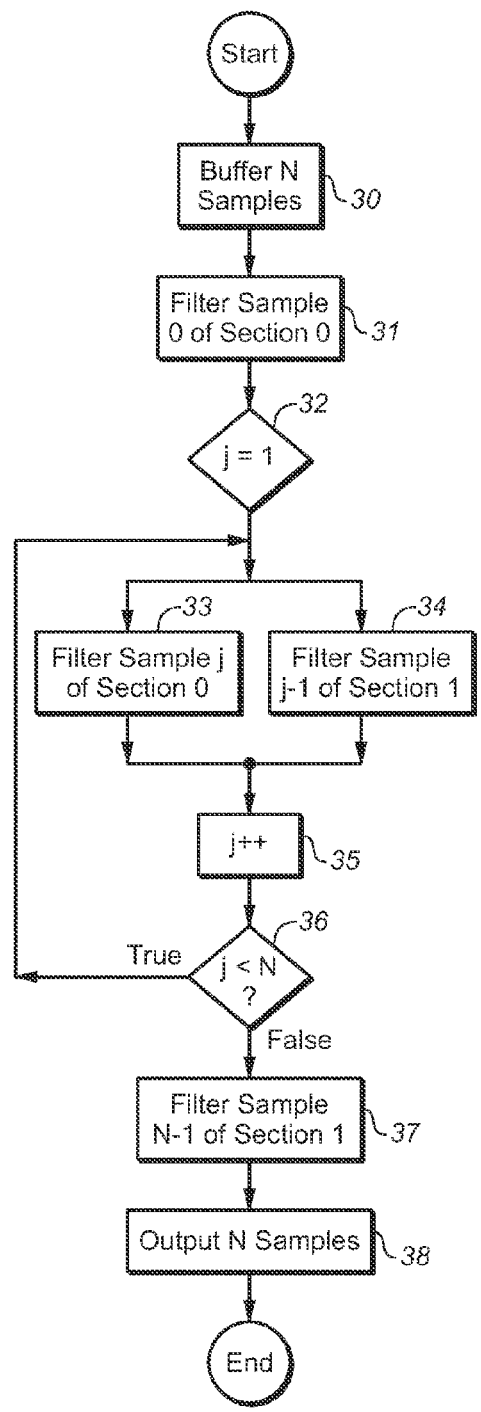
FIG. 3 is a flow chart of an embodiment of the inventive method for performing filtering in a multi-stage biquad filter comprising cascaded biquad filters ("cascaded biquad sections") which operate in parallel in response to a single stream of instructions.

Next, with reference to FIG. 3, we describe an embodiment of the inventive method for filtering a block of data samples (e.g., a block of audio data samples) with a multistage filter comprising a cascade of two biquad filters. Initially, in step 30, each new block of N samples to be filtered is buffered (e.g., in memory 10 of FIG. 4) so as to be available for use in subsequent steps (including steps 31, 33, and 34).

Each sample in a block is identified by index j, where $0 \leq j \leq N-1$. Each stage (section) in the multistage filter is identified by index i, where $0 \leq i \leq 1$.

In step 31, the first input sample (j=0) is filtered in the first (i=0) biquad filter. The value generated by this step is buffered (e.g., in memory 10 of FIG. 4) so as to be available for subsequent use (e.g., in subsequent performances of steps 33 and/or 34).

In step 32, index j is set to 1.

Then, steps 33 and 34 are performed in parallel. In step 33, the "j"th input sample is filtered in the first (i=0) biquad filter, and at least one (e.g., each) value (an "intermediate" value) generated by this step is buffered (e.g., in memory 10 of FIG. 4) so as to be available for use in subsequent steps. In step 34, the "j−1"th input sample to the second (i=1) biquad filter is filtered, and at least one (e.g., each) value (an "intermediate" value) generated by this step is buffered (e.g., in memory 10 of FIG. 4) so as to be available for use in subsequent steps.

Then, in step 35, the index j is incremented. Step 36 determines whether the incremented index j (equal to j+1) is less than N. If it is determined in step 36 that the incremented index j is less than N, steps 33 and 34 are again performed to filter the next input sample to the first biquad filter (in step 33) and the next input sample to the second biquad filter (in step 34). At least one (e.g., each) value (an "intermediate" value) generated by each iteration of each of steps 33 and 34 is buffered (e.g., in memory 10 of FIG. 4) so as to be available for use in subsequent steps. For example, one or more intermediate values generated in one or more previous iterations of step 33 may be retrieved from the buffer for use in a performance of step 34.

If it is determined in step 36 that the incremented index j is equal to N (so that all input samples in the current block have been filtered in the first biquad filter, then step 37 is performed.

In step 37, the last input sample (j=N−1) to the second (i=1) biquad filter is filtered. The value generated by this step is buffered (e.g., in memory 10 of FIG. 4) so as to be available for subsequent use (e.g., for output in step 38).

Then, in step 38, the N filtered samples generated by the second biquad filter are output (as the output of the multistage filter in response to the current block of N input samples). At this point, any additional block of N samples to be filtered is buffered (in a new performance of step 30) and the FIG. 3 method is repeated to filter the new block of samples in the multistage filter.

The processing performed (during performance of the FIG. 3 method) in each stage of the multistage filter is also described by the following pseudocode, in which N=the number of output samples to be generated by filtering a block of N samples in the multistage filter, outputstage1[k] is the output of the first stage of the multistage filter in response to the kth input sample, outputstage2[k] is the output of the second stage of the multistage filter corresponding to the kth input sample, and input[k] is the kth input sample to the first stage of the multistage filter:

```
{1st sample processing of the 1st stage}
for (j = 1; j < N ; j++)
{
    Outputstage1 [j] = function ( outputstage1[j−1],
              outputstage1[j−2], input[j] , input[j−1], input[j−2] );
    Outputstage2 [j−1] = function ( outputstage2[j−2], outputstage2[j−3],
              outputstage1[j−1] , outputstage1[j−2], outputstage1[j−3] );
}
{ Last ("N−1"th) sample processing of the second stage.}
```

As is apparent from FIG. 3 and the corresponding pseudocode, processing in both stages of the multistage filter is combined in a single sample loop (steps 33, 34, 35, and 36 of FIG. 3). By introducing a one sample latency between the two stages (in the case of a two-stage biquad filter) or more generally, as is described below in relation to FIG. 6, FIG. 7, and FIG. 8, a one sample latency between each stage of a multistage filter having two or more biquad filter stages, processing in all stages of the multistage filter may be fully parallelized in accordance with the invention. Processing of a block of samples in all biquad filter stages of a multistage filter may thus be parallelized in a single sample loop (combined for all stages), in accordance with the described embodiment of the invention.

Variations on the FIG. 3 embodiment of the inventive method, for filtering a block of data samples (e.g., a block of audio data samples) with a multistage filter comprising a cascade of M biquad filters (where M is greater than 2) are contemplated. Such variations are typically implemented in a manner to be described with reference to FIGS. 6, 7, and 8.

Figure 6:
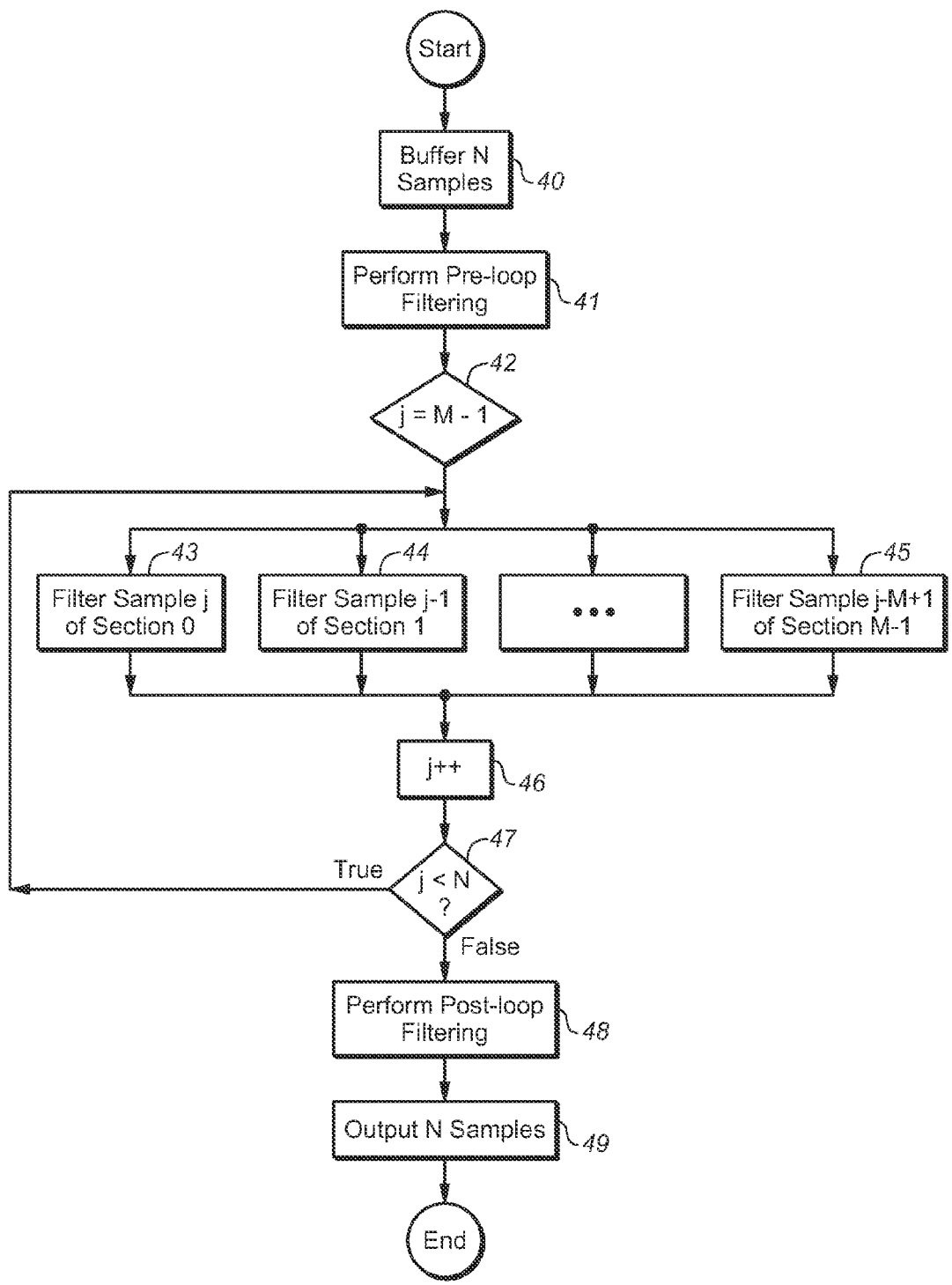
FIG. 6 is a flow chart of another embodiment of the inventive method for performing filtering in a multi-stage biquad filter comprising cascaded biquad filters ("cascaded biquad sections") which operate in parallel in response to a single stream of instructions.

Initially, in step 40 of the FIG. 6 flow chart, each new block of N samples to be filtered is buffered (e.g., in memory 10 of FIG. 4) so as to be available for use in subsequent steps (including steps 41, 43-45, and 48).

Each sample in a block is identified by index j, where $0 \leq j \leq N-1$. Each biquad stage (section) in the multistage filter is identified by index i, where $0 \leq i \leq M-1$.

Figure 7:
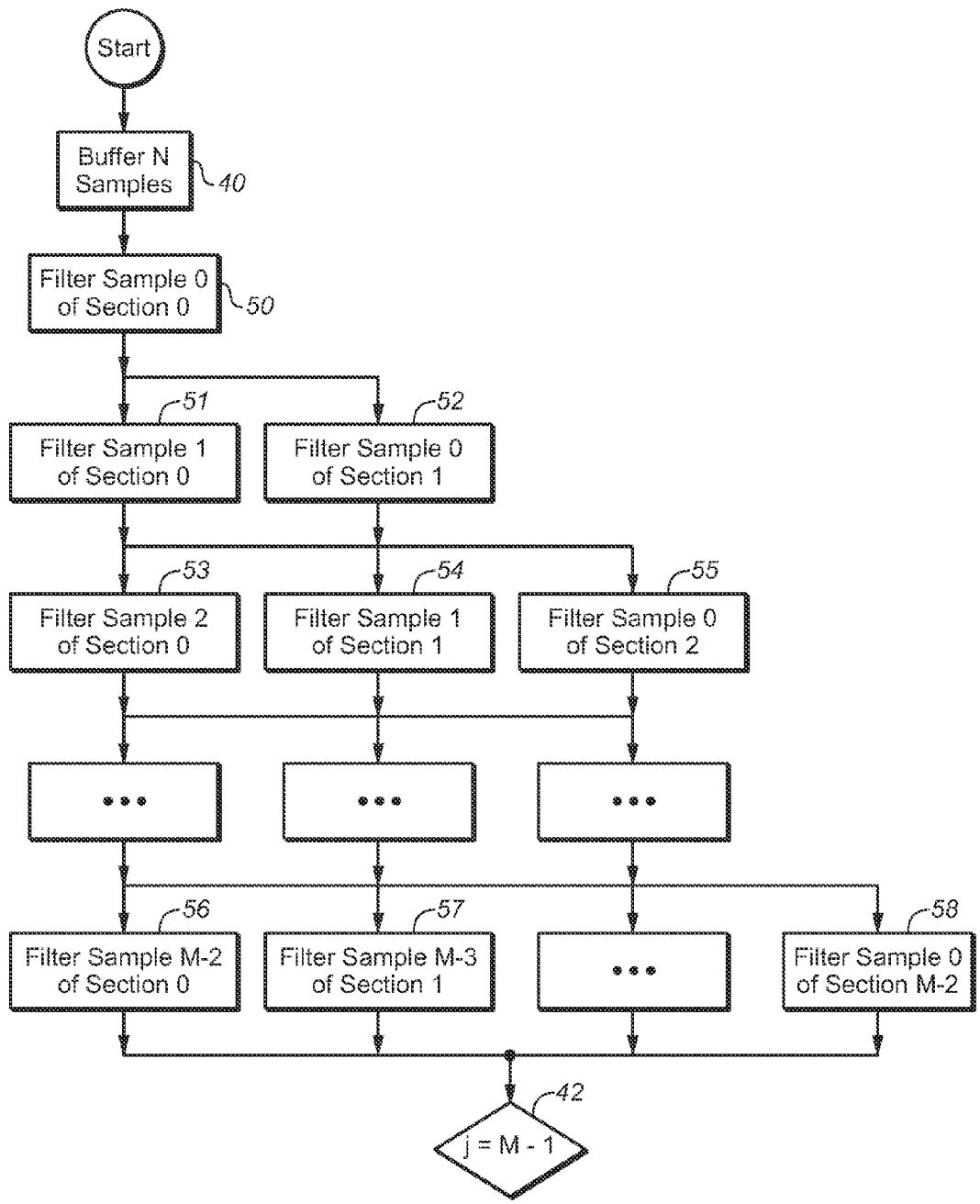
FIG. 7 is a flow chart of an embodiment of steps 40, 41, and 42 of the FIG. 6 embodiment of the inventive method.

In step 41, pre-loop filtering is performed on the first M−1 input samples (j=0 through j=M−2) in the biquad filter stages i=0 through i=M−2 (e.g., in the manner to be described with reference to FIG. 7). It should be noted, as shown in FIG. 7, that for some biquad filter stages, pre-loop filtering occurs corresponding to only a subset of the first M−1 input samples. The values generated by this step are buffered (e.g., in memory 10 of FIG. 4) so as to be available for subsequent use (e.g., in subsequent performances of steps 43-45).

In step 42, index j is set to M−1.

Then, steps 43-45 (one step for each of the M stages) are performed in parallel. In step 43, the "j"th input sample to the first (i=0) biquad filter is filtered, and at least one (e.g., each) value (an "intermediate" value) generated by this step is buffered (e.g., in memory 10 of FIG. 4) so as to be available for use in subsequent steps. In step 44, the "j−1"th input sample to the second (i=1) biquad filter is filtered, and at least one (e.g., each) value (an "intermediate" value) generated by this step is buffered (e.g., in memory 10 of FIG. 4) so as to be available for use in subsequent steps. Similarly (in at least one step performed in parallel with steps 43 and 44, assuming M is greater than 2), the "j−2"th input sample to the third (i=2) biquad filter is filtered, the "j−3"th input sample to the fourth (i=3) biquad filter is filtered (assuming M is greater than or equal to 4), and so on for each additional one of the biquad filters i=4 through i=M−2, and at least one (e.g., each) value (an "intermediate" value) generated by each such step is buffered so as to be available for use in subsequent steps. In step 45 (performed in parallel with steps 43 and 44, if M is greater than 2), the "j−M+1"th input sample to the last (i=M−1) biquad filter is filtered, and at least one (e.g., each) value (an "intermediate" value) generated by this step is buffered (e.g., in memory 10 of FIG. 4) so as to be available for use in subsequent steps.

Then, in step 46, the index j is incremented, and step 47 determines whether the incremented index j (equal to j+1) is less than N. If it is determined in step 47 that the incremented index j is less than N, steps 43-45 (and any other step(s) performed in parallel with steps 43-45) are again performed to filter the next sample in the first biquad filter (in step 43), the next sample in the second biquad filter (in step 44), and so on for each additional biquad filter stage. At least one (e.g., each) value (an "intermediate" value) generated by each iteration of each of steps 43-45 is buffered (e.g., in memory 10 of FIG. 4) so as to be available for use in subsequent steps. For example, one or more intermediate values generated in one or more previous iterations of step 43 may be retrieved from the buffer for use in a performance of step 44.

If it is determined in step 47 that the incremented index j is equal to N (so that all input samples in the current block have been filtered in one of the biquad filters (the filter for which i=0), then post-loop filtering step 48 is performed.

In step 48, post-loop filtering is performed on any remaining unfiltered input samples to the biquad filter stages i=1 through i=M−1 (e.g., in the manner to be described with reference to FIG. 8). The value(s) generated by this step are buffered (e.g., in memory 10 of FIG. 4) so as to be available for subsequent use (e.g., for output in step 49).

After step 48, in step 49, the N filtered samples generated by the final (i=M−1) biquad filter are output (as the output of the multistage filter in response to the current block of N input samples). At this point, any additional block of N samples to be filtered is buffered (in a new performance of step 40) and the FIG. 6 method is repeated to filter the new block of samples in the multistage filter.

FIG. 7 is a flow chart of steps 40 and 42, and details of an embodiment of step 41, of the FIG. 6 embodiment of the inventive method. Steps 50-58 of FIG. 7 are an implementation of pre-loop filtering step 41 of FIG. 6. In step 50, the first sample (j=0) of the current block is filtered in the first biquad filter stage (i=0), and the filtered sample value generated by this step is buffered (e.g., in memory 10 of FIG. 4) so as to be available for subsequent use (e.g., in steps 51 and 52). In step 51, the second sample of the block (j=1) is filtered in the first biquad filter stage (i=0), and the filtered sample value generated by this step is buffered (e.g., in memory 10 of FIG. 4) so as to be available for subsequent use (e.g., in step 53). In step 52, the first sample of the block (j=0) to the second biquad filter stage (i=1) is filtered, and the filtered sample value generated by this step is preferably buffered (e.g., in memory 10 of FIG. 4) so as to be available for subsequent use (e.g., in step 54). Steps 51 and 52 are preferably performed in parallel (in response to the same instruction or sequence of instructions asserted to the first and second stages).

In the steps shown vertically below step 51 in FIG. 7 (including steps 53 and 56), each of the third sample (j=2) through "M−1"th sample (j=M−2) of the current block is filtered in the first biquad filter stage (i=0), and the filtered sample value generated by each such step is buffered so as to be available for subsequent use. In step 53, the third sample (j=2) of the block is filtered in the first biquad filter stage (i=0), and the filtered sample value generated by such step is buffered so as to be available for subsequent use. In step 56, the "M−1"th sample (j=M−2) of the current block is filtered in the first biquad filter stage (i=0), and the filtered sample value generated by such step is buffered so as to be available for subsequent use.

In the steps shown vertically below step 52 in FIG. 7 (including steps 54 and 57), each of the second input sample (j=1) through the "M−2"th input sample (j=M−3) to the second biquad filter stage (i=1) is filtered, and the filtered sample value generated by each such step is buffered so as to be available for subsequent use. In step 54, the second input sample (j=1) to the second biquad filter stage is filtered, and the filtered sample value generated by such step is buffered (e.g., in memory 10 of FIG. 4) so as to be available for subsequent use. In step 57, the "M−2"th input sample (j=M−3) to the second biquad filter stage is filtered, and the filtered sample value generated by such step is buffered (e.g., in memory 10 of FIG. 4) so as to be available for subsequent use.

Generally, for the "k"th biquad filter stage, where k is in index which ranges from 0 through M−2, a sequence of steps (a column of steps in FIG. 7) is performed to filter each of the first input sample (j=0) to the "k"th biquad filter stage through the "M−1−k"th input sample (j=M−2−k) to the "k"th biquad filter stage, and the filtered sample value(s) generated by each such step is(are) buffered (e.g., in memory 10 of FIG. 4) so as to be available for subsequent use.

Thus, if M=3, steps 53, 54, and 55 of FIG. 7 are performed (preferably in parallel). In step 53, the third input sample (j=2) to the first biquad filter stage (i=0) is filtered, and the filtered sample value generated by this step is buffered. In step 54, the second input sample (j=1) to the second biquad filter stage (i=1) is filtered, and the filtered sample value generated by this step is buffered. In step 55, the first input sample (j=0) to the third biquad filter stage (i=2) is filtered, and the filtered sample value generated by this step is buffered.

Similarly, if M>5, the steps of the row of steps below the row including steps 53-55 (as indicated in FIG. 7) are then performed (preferably in parallel), and then the steps of the row of steps which includes steps 56, 57, and 58 of FIG. 7 are performed (preferably in parallel). In step 56, the "M−1"th input sample (j=M−2) to the first biquad filter stage (i=0) is filtered, and the filtered sample value generated by this step is buffered. In step 57, the "M−2"th input sample (j=M−3) to the second biquad filter stage (i=1) is filtered, and the filtered sample value generated by this step is buffered. In step 58, the first input sample (j=0) to the "M−1"th biquad filter stage (i=M−2) is filtered, and the filtered sample value generated by this step is buffered.

The steps of each row of steps in FIG. 7 (e.g., steps 51 and 52, or steps 53, 54, and 55) are preferably performed in parallel (in response to the same instruction or sequence of instructions asserted to the relevant stages).

Figure 8:
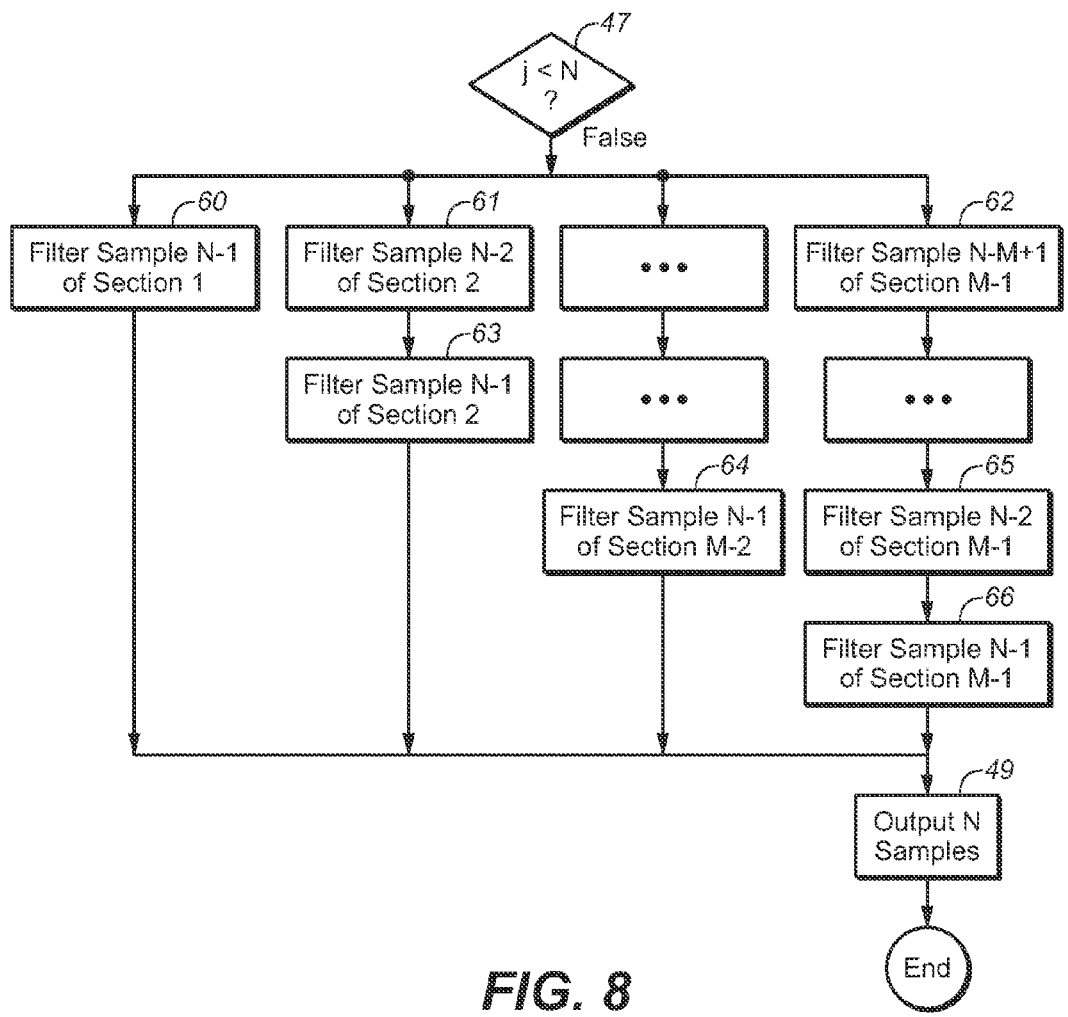
FIG. 8 is a flow chart of an embodiment of steps 47, 48, and 49 of the FIG. 6 embodiment of the inventive method.

FIG. 8 is a flow chart of an embodiment of steps 47 and 49, and details of an embodiment of step 48, of the FIG. 6 embodiment of the inventive method. Steps 60-66 of FIG. 8 are an implementation of post-loop filtering step 48 of FIG. 6.

Generally, as shown in FIG. 8, for the "k"th biquad filter stage, where k is an index which ranges from 1 through M−1, a sequence of steps (a column of steps in FIG. 8) is performed to filter each of the "N−k+1"th input sample (j=N−k) to the "k"th biquad filter stage through the last input sample (j=N−

1) to the "k"th biquad filter stage, and the filtered sample value(s) generated by each such step is(are) buffered (e.g., in memory 10 of FIG. 4) so as to be available for subsequent use.

For example, in step 60, the last sample (j=N−1) of the current block is filtered in the second biquad filter stage (i=1), and the filtered sample value generated by this step is buffered (e.g., in memory 10 of FIG. 4) so as to be available for subsequent use. In step 61, the second last sample of the block (j=N−2) is filtered in the third biquad filter stage (i=2), and the filtered sample value generated by this step is buffered (e.g., in memory 10 of FIG. 4) so as to be available for subsequent use (e.g., in step 63). In step 63, the last (j=N−1) sample of the block is filtered in the third biquad filter stage (i=2), and the filtered sample value generated by this step is preferably buffered (e.g., in memory 10 of FIG. 4) so as to be available for subsequent use.

In step 64, the last (j=N−1) sample of the block is filtered in the second last biquad filter stage (i=M−2), and the filtered sample value generated by this step is preferably buffered (e.g., in memory 10 of FIG. 4) so as to be available for subsequent use.

In step 62, the "N−M+1"th sample of the block is filtered in the last biquad filter stage (i=M−1), and the filtered sample value generated by this step is preferably buffered (e.g., in memory 10 of FIG. 4) so as to be available for subsequent use (e.g., in steps vertically below step 62 in FIG. 8). In step 65, the second last (j=N−2) sample of the block is filtered in the last biquad filter stage (i=M−1), and the filtered sample value generated by this step is preferably buffered (e.g., in memory 10 of FIG. 4) so as to be available for subsequent use (e.g., in step 66 in FIG. 8). In step 66, the last (j=N−1) sample of the block is filtered in the last biquad filter stage (i=M−1), and the filtered sample value generated by this step is preferably buffered (e.g., in memory 10 of FIG. 4) so as to be available for subsequent use.

The steps of each row of steps in FIG. 8 (e.g., steps 64 and 65, or the steps in the row including steps 60, 61, and 62) are preferably performed in parallel (in response to the same instruction or sequence of instructions asserted to the relevant stages).

The FIG. 3 method (and variations thereon for filtering a block of data samples with a multistage filter comprising a cascade of more than two biquad filters) performs multistage filtering of a block of N input samples in a single loop with iteration over a sample index (index j of FIG. 3) but without iteration over a biquadratic filter stage index. In contrast, the conventional method of FIG. 2 processes a block of data samples in two nested loops with iteration over both a sample index (index j of FIG. 2) and iteration over a biquadratic filter stage index (index i of FIG. 2).

In typical embodiments (e.g., the FIG. 4 embodiment to be described below), the stages of the inventive multistage filter (each of which stages is a biquad filter) are combined with latency between the stages, such that all the stages can operate independently, allowing parallelization of the processing of the different stages. All the stages can operate in parallel (to filter a block of input data values), in response to a single, common stream of instructions from a controller, but with each stage operating on different data values, with at least one of the stages operating on data values which include buffered values (generated by another one of the stages in response to a subset of the input data values, and stored with different latencies in a buffer memory before being retrieved for processing in said one of the stages). Thus, the multistage filter has a SIMD (single instruction, multiple data) architecture in which the individual biquad filter stages operate independently and in parallel in response to the single stream of instructions. For example, the multistage filter may include N stages, and one of the stages (the "M+1"th stage in the sequence) may operate on data values generated by a previous one of the stages (the "M"th stage in the sequence) at different times (e.g., in response to a sequence of different input data values of the block), stored in a buffer memory (at different times), and read (by the "(M+1)"th stage) from the buffer memory after residing in the buffer memory with different latency times.

Figure 4:
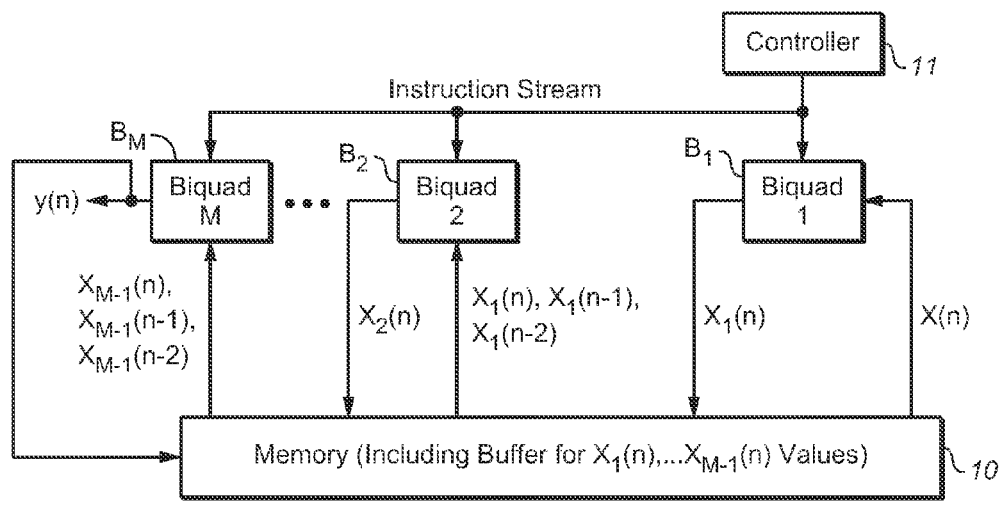
FIG. 4 is a block diagram of a multi-stage filter (e.g., implemented by programming a DSP or other processor in accordance with an embodiment of the invention) which comprises cascaded biquad filters and which can perform a method of the type described with reference to FIG. 3.

Next, with reference to FIG. 4, we describe a class of embodiments of the inventive multistage filter. The multistage filter of FIG. 4 includes multiple biquad filters (M biquad filters, where M is an integer greater than one) and is configured to perform a method of the type described with reference to FIG. 3 (or a variation on such a method, such as that shown in FIG. 6). The FIG. 4 filter includes memory 10, controller 11, and biquad filters $B_1, B_2, \ldots, B_M$, connected as shown, and is configured to filter a block of N input data values x(n), where "n" is an index ranging from 1 through N, in response to a single stream of instructions asserted to the biquad filters by controller 11. Each of input data values x(n) may be an audio data sample.

It should be appreciated that the expression that a "single stream of instructions" is asserted to individual stages (e.g., each of which is a biquad filter) of a multistage filter, is used herein in a broad sense including both: cases in which a single stream of instructions is asserted to all the stages (e.g., on a single bus or conductor to which all the stages are coupled); and cases in which identical (or substantially identical) streams of instructions are asserted simultaneously (or substantially simultaneously) to the stages (e.g., each stream asserted on different bus or conductor coupled to a different one of the stages).

In response to the block of input data values x(n), filter $B_1$ generates N intermediate (biquad filtered) values $x_1(n)$, and asserts them to buffer memory locations in memory 10. In operation, filter $B_2$ retrieves required intermediate values $x_1(n)$ from memory 10, generates intermediate (biquad filtered) values $x_2(n)$ in response thereto, and asserts the intermediate values that it generates to buffer memory locations in memory 10. Similarly, in operation, each other one of the biquad filters (filter $B_i$, where i is an index ranging from 3 to M) retrieves intermediate values $x_{i-1}(n)$ from memory 10, generates biquad filtered values $x_i(n)$ in response thereto, and asserts the values that it generates to buffer memory locations in memory 10. The biquad filtered values, $x_M(n)=y(n)$, generated in the final biquad filter ($B_M$) comprise a block of N fully filtered output data values generated in response to the block of input data values x(n).

Memory 10 includes memory locations which store each block of input data x(n), and buffer memory locations which store intermediate values $x_1(n), \ldots, x_{M-1}(n)$ generated by the biquad filters $B_1, B_2, \ldots, B_{M-1}$ (e.g., buffer locations that store intermediate values $x_1(n), \ldots, x_{M-1}(n)$ generated for each block of input data). In some implementations, for which calculations are performed in place, the same memory locations which are used to store input data x(n) may be used to store intermediate values $x_1(n), \ldots, x_{M-1}(n)$ once particular input data samples are no longer needed by the multistage filter. In such implementations, memory 10 typically does not need to include more (or significantly more) memory locations than does a conventional memory (for implementing a conventional, non-parallelized version of the multistage filter), since such a conventional memory would typically include memory locations for storing each block of input data, x(n), to be filtered, and each output value generated by each of stages of the multistage filter that is required for operation of the stage itself and/or for operation of each subsequent stage of the filter.

Figure 9:
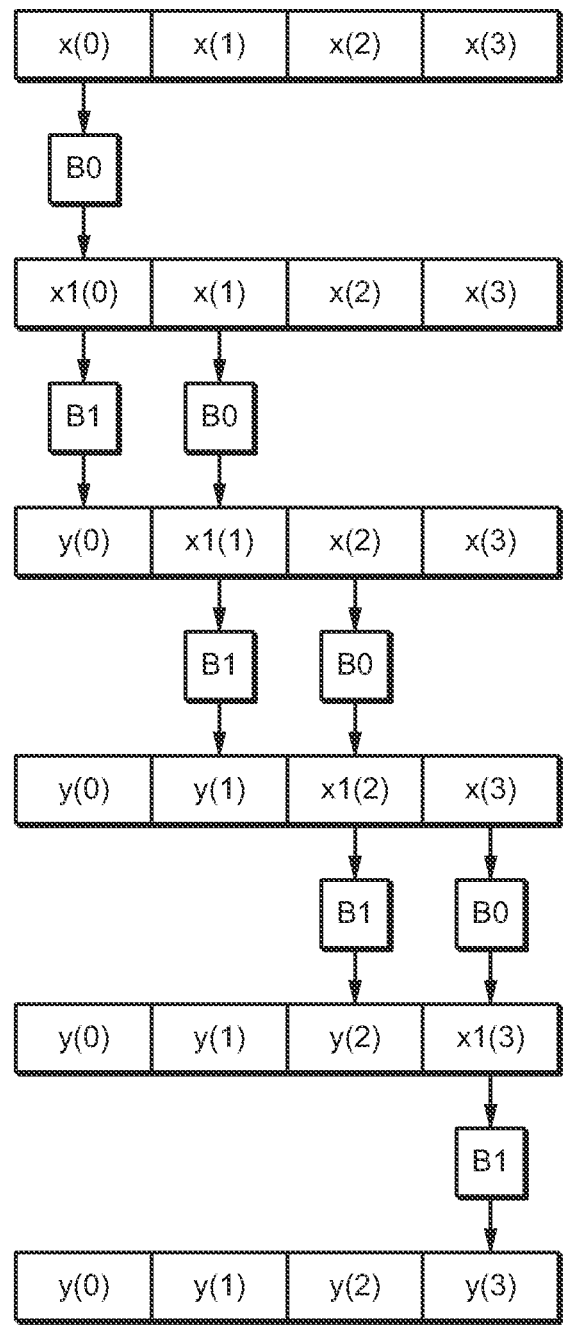
FIG. 9 is a diagram of values generated in an implementation of the FIG. 4 system in which calculations are performed in place.

For example, FIG. 9 is a diagram of values generated in an implementation of the FIG. 4 system in which calculations are performed in place, in the case that N=4 and M=2 (i.e., two stage biquad operating on blocks of 4 samples at a time).

In the FIG. 9 example, we start with four samples in the input buffer, x(0) . . . x(3).

In a first step, sample x(0) is filtered through filter B0 (first stage biquad) to produce sample x1(0). Sample x1(0) is stored in memory in the location previously occupied by sample x(0). All other memory locations are unchanged. In a second step, sample x1(0) is filtered through filter B1 (second stage biquad) to produce sample y(0). Sample y(0) is stored in memory in the location previously occupied by sample x1(0).

In parallel, sample x(1) is filtered through filter B0 to produce sample x1(1). Sample x1(1) is stored in memory in the location previously occupied by sample x(1).

In subsequent steps, processing continues until all input samples x(0) . . . x(3) have been replaced by output samples y(0) . . . y(3).

In the FIG. 9 example, when filter B1 is applied to sample x1(2), samples x1(1) and x1(0) no longer reside in the buffer (having been replaced by y(0) and y(1)). Instead, samples which were derived by filter B1 from x1(1) and x1(0) (i.e., samples corresponding to $s_1(n)$ and $s_2(n)$ in FIG. 1) are contained in 2 state variables associated with filter B1.

Figure 1:
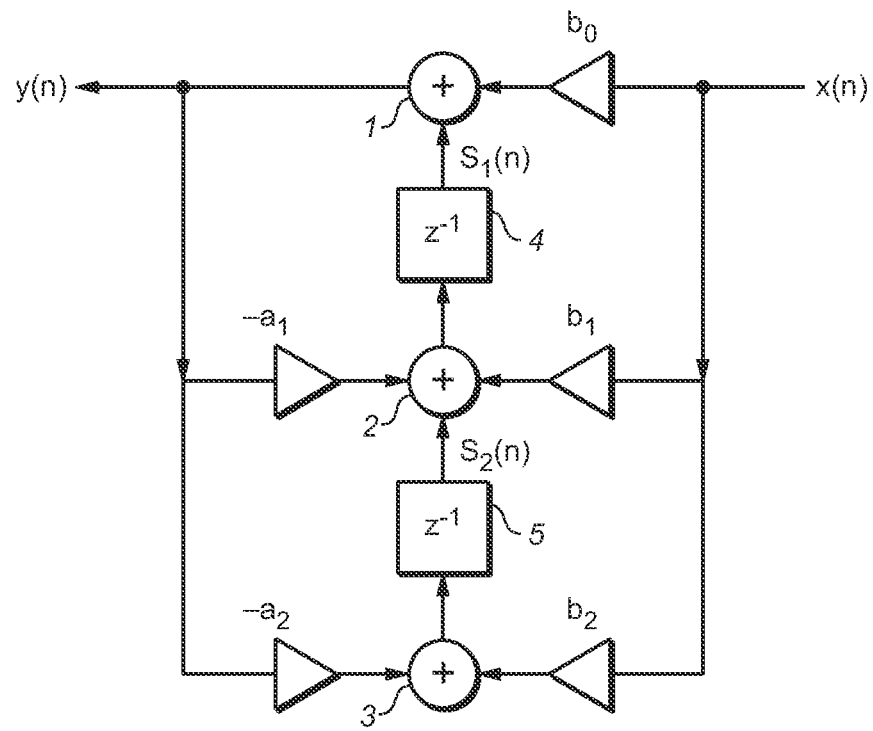
FIG. 1 is a block diagram of a conventional biquad filter.
Figure 1A:
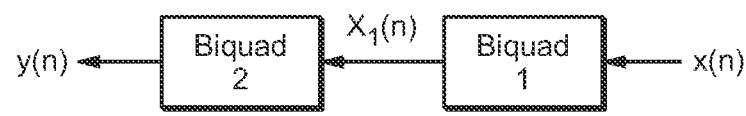
FIG. 1A is a block diagram of a conventional multistage biquad filter.

In the FIG. 9 example, each filter (e.g., each of filters B0 and B1) requires access to memory locations which store the two samples (corresponding to $s_1(n)$ and $s_2(n)$ in FIG. 1) that it generates (in response to the "j−1"th and "j−2"th input samples of the current block of N input samples) for use in filtering the "j"th input sample of the current block. These memory locations could be within memory 10 of the FIG. 4 system (or could be other buffer memory locations).

For each of the filters, each pair of stored samples (corresponding to $s_1(n)$ and $s_2(n)$ in FIG. 1) that have been generated by the filter are updated each time a new input sample (with an incremented index j) is asserted to the filter. The stored samples (corresponding to $s_1(n)$ and $s_2(n)$ in FIG. 1) are examples of "intermediate values" (as this phrase is used elsewhere herein) that are generated by the filter (which is one stage of a multistage filter) and buffered for subsequent use in accordance with the invention, but they are subsequently used by the filter stage which generated them (not by a different filter stage of the multistage filter).

Although FIG. 9 shows a specific example of the inventive method using in place filtering, in which the block size (N) is equal to 4 and the number of biquad filter stages (M) in the inventive filter is equal to 2, embodiments of the inventive method using in place filtering are contemplated for any values of M and N subject to the constraints that M>1 and N>M. In the FIG. 9 implementation (and other embodiments using in place filtering in which the block size is different than 4 and/or the number of biquad stages is different than 2), the same memory locations (e.g., in memory 10 of FIG. 4) which are used to store input data x(n) may be used to store intermediate values $x_i(n), \ldots, x_{M-1}(n)$ once particular input data samples are no longer needed by the multistage filter.

The FIG. 4 filter can be implemented by programming a digital signal processor (DSP) or other processor which includes a memory (functioning as memory 10), a controller (functioning as controller 11), and ALUs (arithmetic logic units) or AMUs (arithmetic manipulation units), with each of biquad filters $B_1, B_2, \ldots, B_M$ being implemented as an appropriately configured one of the ALUs or AMUs.

Thus, the FIG. 4 filter includes:

a buffer memory (buffer locations in memory 10);

at least two biquad filter stages (biquad filters $B_1, B_2, \ldots, B_M$), including a first biquad filter stage (e.g., biquad filter $B_1$) and a subsequent biquad filter stage (e.g., biquad filter $B_2$); and a controller (controller 11), coupled to the biquad filter stages and configured to assert a single stream of instructions to both the first biquad filter stage and the subsequent biquad filter stage. The first biquad filter stage and the subsequent biquad filter stage (and each other biquad filter stage of the FIG. 4 filter) operate independently and in parallel in response to the stream of instructions.

The first biquad filter stage is coupled to the memory and configured to perform biquadratic filtering on a block of N input samples in response to the stream of instructions to generate intermediate values (e.g., the values $x_1(n)$), and to assert the intermediate values to the memory (for storage in said memory). These intermediate values include a filtered version of each one of the input samples. In certain embodiments of the invention, no more than one intermediate value $x_1(n)$ need be present in memory 10 at any one time. The subsequent biquad filter stage is coupled to the memory and configured to perform biquadratic filtering on buffered values retrieved from the memory in response to the stream of instructions to generate a block of output values (e.g., the values $x_2(n)$), wherein the output values include an output value corresponding to each of the input samples in the block of N input samples, and the buffered values include at least some of the intermediate values generated in the first biquad filter stage in response to the block of N input samples.

The subsequent biquad filter stage (e.g., filter $B_2$ of FIG. 4), in an embodiment in which the multistage filter has M stages, is configured to generate an output value corresponding to the "j"th one of the input samples in response to a subset of the buffered values retrieved from the memory, where j is an index in the range from M−1 to N−1, said subset including the filtered version of the "j"th one of the input samples, the filtered version of a "j−1"th one of the input samples, and the filtered version of a "j−2"th one of the input samples.

The subsequent biquad filter stage (e.g., filter $B_2$ of FIG. 4) is configured to generate an output value ($x_2(n)$) corresponding to each of the input samples, x(n), in response to a different subset of the buffered values retrieved from the memory, each said subset includes at least two (e.g., three) of the intermediate values generated in the first biquad filter stage (e.g., the values $x_1(n), x_1(n-1),$ and $x_1(n-2)$, indicated in FIG. 4) and retrieved from the memory after residing in said memory for different latency times. More specifically, in an embodiment in which the multistage filter has M stages, the subset of the buffered values retrieved by filter $B_2$ to generate the output value corresponding to a "j"th one of the input samples, where j is an index in the range from M−1 to N−1, includes at least one value generated in the first biquad filter stage in response to the "j"th one of the input samples, at least one value generated in the first biquad filter stage in response to the "j−1"th one of the input samples, and at least one value generated in the first biquad filter stage in response to the "j−2"th one of the input samples.

The FIG. 4 filter is configured to perform multistage filtering on a block of N input samples (data values x(n)), including by performing the steps of:

(a) performing a first biquadratic filtering operation on the block of N input samples to generate intermediate values (e.g., the values $x_1(n), x_1(n-1),$ and $x_1(n-2)$, indicated in FIG. 4), and asserting the intermediate values to a buffer memory (for storage in said memory), wherein the intermediate values include a filtered version of each of at least a subset of the input samples; and (b) performing a second biquadratic filtering operation on buffered values retrieved from the memory, to generate a block of output values (e.g., the values $x_2(n)$ indicated in FIG. 4), wherein the output values include an output value corresponding to each of the input samples in the block of N input samples, a different subset of the buffered values is retrieved and filtered to generate the output value corresponding to each of the input samples in the block, and each said subset of the buffered values includes at least two (e.g., three) of the intermediate values generated during performance of step (a) (e.g., the values $x_1(n)$, $x_1(n-1)$, and $x_1(n-2)$, indicated in FIG. 4) which are retrieved from the memory after residing in said memory for different latency times, wherein steps (a) and (b) are performed in response to a single stream of instructions, such that steps (a) and (b) are performed independently and in parallel in response to the single stream of instructions.

The buffered values retrieved in step (b) to generate the output value corresponding to a "j"th one of the input samples in an embodiment in which the filtering is performed in a multistage filter having M stages, where j is an index in the range from M−1 to N−1, include the filtered version of the "j"th one of the input samples generated in step (a), the filtered version of a "j−1"th one of the input samples generated in step (a), and the filtered version of a "j−2"th one of the input samples generated in step (a).

Figure 5:
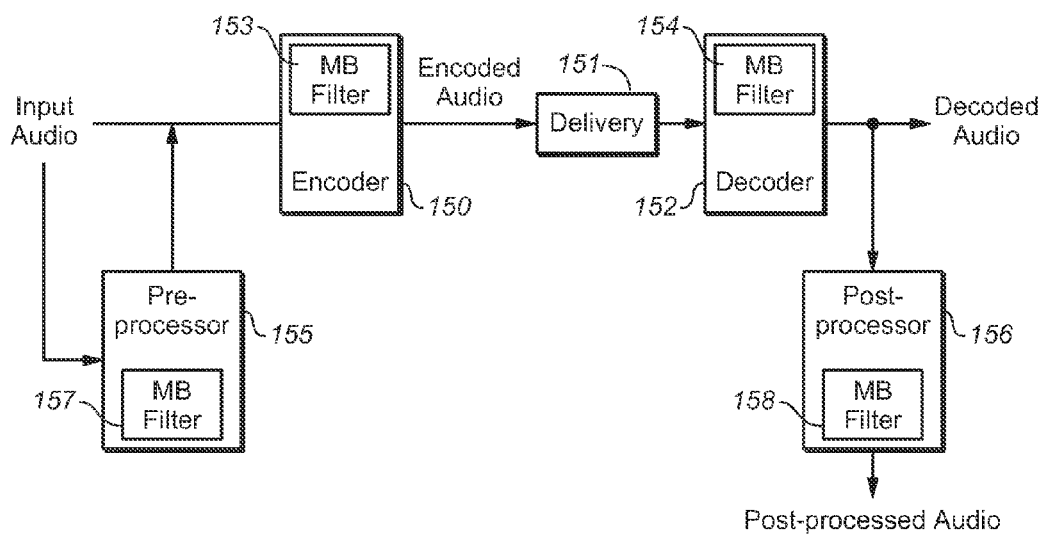
FIG. 5 is a block diagram of a system including an encoder (including an embodiment of the inventive multistage filter) and a decoder (also including an embodiment of the inventive multistage filter).

FIG. 5 is a block diagram of a system including an encoder (encoder 150) including an embodiment of the inventive multistage filter ("M B filter" 153). For example, filter 153 may be of the type shown in and described with reference to FIG. 4. Encoder 150 optionally includes two or more multistage filters, each of which is an embodiment of the inventive multistage filter. In response to input audio data samples, encoder 150 generates encoded audio data and asserts the encoded audio data to delivery subsystem 151.

Delivery subsystem 151 is configured to store the encoded audio data and/or to transmit a signal indicative of the encoded audio data. Decoder 152 is coupled and configured (e.g., programmed) to receive the encoded audio data from subsystem 151 (e.g., by reading or retrieving the encoded audio data from storage in subsystem 151, or receiving a signal indicative of the encoded audio data that has been transmitted by subsystem 151).

Decoder 152 includes an embodiment of the inventive multistage filter ("M B filter" 154). For example, filter 154 may be of the type shown in and described with reference to FIG. 4. Decoder 152 optionally includes two or more multistage filters, each of which is an embodiment of the inventive multistage filter. Decoder 152 operates to decode the encoded audio data, thereby generating decoded audio data.

The FIG. 5 system also includes audio pre-processing subsystem ("pre-processor") 155 configured to perform preliminary processing of audio data to be encoded by encoder 150. Pre-processor 155 includes an embodiment of the inventive multistage filter ("M B filter" 157). For example, filter 157 may be of the type shown in and described with reference to FIG. 4.

The FIG. 5 system also includes audio post-processing subsystem ("post-processor") 156 configured to perform post-processing of decoded audio data that has been decoded by decoder 154. Post-processor 156 includes an embodiment of the inventive multistage filter ("M B filter" 158). For example, filter 158 may be of the type shown in and described with reference to FIG. 4.

In some implementations, encoder 150 is an AC-3 (or enhanced AC-3, or Dolby E) encoder, which is configured to generate an AC-3 (or enhanced AC-3, or Dolby E) encoded audio bitstream in response to time-domain input audio data, and decoder 52 is an AC-3 (or enhanced AC-3, or Dolby E) decoder.

In a class of embodiments, the invention is an audio encoder (e.g., encoder 150 of FIG. 5) configured to generate encoded audio data in response to input audio data, said encoder including at least one multistage filter (which is any embodiment of the inventive multistage filter) coupled and configured to filter the audio data (e.g., to filter a preliminarily processed version of the audio data). Encoder 150 is configured to encode audio data to generate encoded audio data, including by performing an embodiment of the inventive multistage filtering method on the audio data (e.g., on a preliminarily processed version of the audio data).

In a class of embodiments, the invention is an audio decoder (e.g., decoder 152 of FIG. 5) configured to generate decoded audio data in response to encoded audio data, said decoder including at least one multistage filter (which is any embodiment of the inventive multistage filter) coupled and configured to filter the encoded audio data (e.g., to filter a preliminarily processed version of the encoded audio data). Decoder 152 is configured to decode encoded audio data to generate decoded audio data, including by performing an embodiment of the inventive multistage filtering method on the encoded audio data (e.g., on a preliminarily processed version of the encoded audio data).

Another embodiment of the invention is a pre-processor (e.g., pre-processor 155 of FIG. 5) for performing preliminary processing of audio data (e.g., audio data to be encoded by an encoder), wherein the pre-processor includes at least one multistage filter (which is any embodiment of the inventive multistage filter) coupled and configured to filter the audio data (e.g., data that is input to the pre-processor or a preliminarily processed version of such input data).

Another embodiment of the invention is a post-processor (e.g., post-processor 156 of FIG. 5) for performing post-processing of decoded audio data that has been decoded by an decoder, wherein the post-processor includes at least one multistage filter (which is any embodiment of the inventive multistage filter) coupled and configured to filter audio data (e.g., decoded data that is input to the post-processor or a processed version of such input data).

Figure 10:
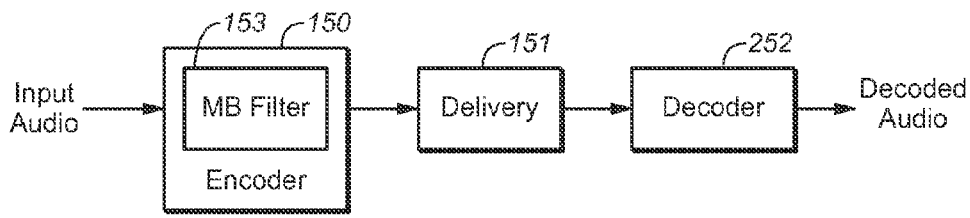
FIG. 10 is a block diagram of a system including an encoder (including an embodiment of the inventive multistage filter) and a decoder which is an embodiment of the inventive decoder.

FIG. 10 is a block diagram of a system including an encoder (encoder 150) including an embodiment of the inventive multistage filter ("M B filter" 153). Encoder 150 of FIG. 10 is identical to encoder 150 of FIG. 5, and may be implemented in any of the ways in which encoder 150 of FIG. 5 may be implemented. Multistage filter 153 may implement any embodiment of the inventive multistage filter. In response to input audio data samples, encoder 150 generates encoded audio data (representing one or more input audio channels) and asserts the encoded audio data to delivery subsystem 151.

Delivery subsystem 151 is configured to store the encoded audio data and/or to transmit a signal indicative of the encoded audio data. Subsystem 151 of FIG. 10 is identical to subsystem 151 of FIG. 5 and may be implemented in any of the ways in which subsystem 151 of FIG. 5 may be implemented.

Decoder 252 of FIG. 10 has an input coupled to receive the encoded audio data from subsystem 151 (e.g., by reading or retrieving the encoded audio data from storage in subsystem 151, or receiving a signal indicative of the encoded audio data that has been transmitted by subsystem 151).

Decoder 252 is configured (e.g., programmed) to extract (from the received encoded bitstream) encoded data representing one or more channels of audio information processed by multistage filter 153, and to decode the encoded data to provide decoded representations of the one or more channels of audio information.

In accordance with typical embodiments of the present invention, SIMD instructions (or instructions for parallel processing by multiple ALUs or AMUs) are used to program a processor (e.g., a digital signal processor or general purpose processor) to implement a multistage filter. The multistage filter may implement bandwidth limiting low pass filtering, low pass filtering (e.g., in an LFE subsystem of an audio encoder), high pass filtering (e.g., in a transient detector subsystem of an audio encoder), or other filtering.

Other aspects of the invention include a system or device (e.g., an encoder, a decoder, or a processor) configured (e.g., programmed) to perform any embodiment of the inventive method, and a computer readable medium (e.g., a disc) which stores code for implementing any embodiment of the inventive method or steps thereof. For example, the inventive system can be or include a programmable general purpose processor, digital signal processor, or microprocessor, programmed with software or firmware and/or otherwise configured to perform any of a variety of operations on data, including an embodiment of the inventive method or steps thereof. Such a general purpose processor may be or include a computer system including an input device, a memory, and processing circuitry programmed (and/or otherwise configured) to perform an embodiment of the inventive method (or steps thereof) in response to data asserted thereto.

Some embodiments of the invention are encoders (e.g., encoders which encode audio data in accordance with the Dolby Digital Plus, AC-3, or Dolby E format) or decoders, implemented as programmed processors (e.g., ARM neon processors, each of which is an ARM Cortex processor with a Neon SIMD engine allowing parallel processing, or other processors having SIMD (single instruction, multiple data) units and/or multiple ALUs (arithmetic logic units) or AMUs (arithmetic manipulation units)) or programmed (and/or otherwise configured) digital signal processors (e.g., DSPs having SIMD units and/or multiple ALUs or AMUs).

Combining operations of all biquad filter stages of a multistage biquad filter (in a single sample loop) in accordance with typical embodiments of the invention improves performance by enabling parallelism. Processors with SIMD units and multiple ALUs (or AMUs) can make efficient use of their resources by implementing an embodiment of the inventive method.

Typical embodiments of the inventive method for implementing a multistage biquad filter do not affect the precision of the output or stability of the filter (relative to the precision and stability attainable by a conventional implementation of the filter).

Tests performed by the inventor have shown that an encoder, configured to encode audio data in accordance with the Dolby Digital Plus format, and implemented as a Texas Instruments C64 digital signal processor programmed to include an embodiment of the inventive two-stage biquad filter (implementing high pass filtering in a transient detector subsystem of the encoder) required only an average of 1846 cycles to filter a typical block of audio data, in contrast with the average number of cycles (4141) required to filter the block when the encoder was instead conventionally programmed to include a conventional (non-parallelized) implementation of the two-stage filter.

Tests performed by the inventor have also shown that an encoder, configured to encode audio data in accordance with the Dolby Digital Plus format, and implemented as a Texas Instruments C64 digital signal processor programmed to include an embodiment of the inventive four-stage biquad filter (implementing low pass filtering in a low frequency effects ("LFE") subsystem of the encoder) required only an average of 5802 cycles to filter a typical block of audio data, in contrast with the average number of cycles (10375) required to filter the block when the encoder was instead conventionally programmed to include a conventional (non-parallelized) implementation of the four-stage filter.

It is expected that the invention can also provide similar performance benefits when the inventive filter is implemented by appropriately programming other processors (having other core processor architectures). It is also expected that the degree of performance improvement will depend on the processor architecture, the number of stages of the filter, and number of poles in the filter.

The invention may be implemented in hardware, firmware, or software, or a combination of both (e.g., as a programmable logic array). Unless otherwise specified, the algorithms or processes included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems (e.g., a computer system which implements the encoder of FIG. 5), each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

For example, when implemented by computer software instruction sequences, various functions and steps of embodiments of the invention may be implemented by multithreaded software instruction sequences running in suitable digital signal processing hardware, in which case the various devices, steps, and functions of the embodiments may correspond to portions of the software instructions.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be implemented as a computer-readable storage medium, configured with (i.e., storing) a computer program, where the storage medium so configured causes a computer system to operate in a specific and predefined manner to perform the functions described herein.

It is contemplated that multistage filters, whose individual stages are IIR filters but are not biquad filters (as they are in the specific embodiments described herein), may be implemented in accordance with the invention so that processing of its individual stages is parallelized (e.g., so that all its stages are operable independently in response to a single, common stream of instructions, to perform fully parallelized processing of data in said stages). For example, a multistage filter of the type described in U.S. Patent Application Publication No. 2012/0019723 A1, published on Jan. 26, 2012, may be modified in accordance with an embodiment of the present invention so that the processing of its individual stages is parallelized (e.g., so that all its stages are operable independently in response to a single, common stream of instructions, to perform fully parallelized processing of data in said stages).

In some embodiments of the inventive method, some or all of the steps described herein are performed simultaneously or in a different order than specified in the examples described herein. Although steps are performed in a particular order in some embodiments of the inventive method, some steps may be performed simultaneously or in a different order in other embodiments.

A number of embodiments of the invention have been described. Nevertheless, it will be understood that various modifications may be made without departing from the spirit and scope of the invention. Numerous modifications and variations of the present invention are possible in light of the above teachings. It is to be understood that within the scope of the appended claims, the invention may be practiced otherwise than as specifically described herein.

What is claimed is:

1. An audio encoder configured to generate encoded audio data in response to input audio data, said encoder including at least one multistage filter coupled and configured to filter the audio data, wherein the multistage filter includes:
    a buffer memory;
    at least two biquad filter stages, including a first biquad filter stage and a subsequent biquad filter stage; and
    a controller, coupled to the biquad filter stages and configured to assert a single stream of instructions to both the first biquad filter stage and the subsequent biquad filter stage, wherein said first biquad filter stage and said subsequent biquad filter stage operate independently and in parallel in response to the stream of instructions,
    wherein the first biquad filter stage is coupled to the memory and configured to perform biquadratic filtering on a block of N input samples in response to the stream of instructions to generate intermediate values, and to assert the intermediate values to the memory, wherein the intermediate values include a filtered version of each of at least a subset of the input samples, and
    wherein the subsequent biquad filter stage is coupled to the memory and configured to perform biquadratic filtering on buffered values retrieved from the memory in response to the stream of instructions to generate a block of output values, wherein the output values include an output value corresponding to each of the input samples in the block of N input samples, and the buffered values include at least some of the intermediate values generated in the first biquad filter stage in response to the block of N input samples, wherein the first biquad filter stage is configured to perform a multiplication on at least one of the input samples in a step of a processing loop determined by the instructions, and the subsequent biquad filter stage is coupled and configured to perform a multiplication on at least one of the intermediate values in said step of the processing loop;
    wherein the multistage filter is configured to perform multistage filtering of the block of N input samples in a single processing loop with iteration over a sample index but without iteration over a biquadratic filter stage index.

2. The encoder of claim 1, wherein the multistage filter has M biquad filter stages, the subsequent biquad filter stage is configured to generate an output value corresponding to a "j"th one of the input samples in response to a subset of the buffered values retrieved from the memory, where j is an index in the range from M−1 to N−1, said subset including the filtered version of the "j"th one of the input samples, the filtered version of a "j−1"th one of the input samples, and the filtered version of a "j−2"th one of the input samples.

3. The encoder of claim 1, wherein the multistage filter has M biquad filter stages, the subsequent biquad filter stage is configured to generate an output value corresponding to a "j"th one of the input samples in response to a subset of the buffered values retrieved from the memory, where j is an index in the range from M−1 to N−1, said subset including the filtered version of the "j"th one of the input samples generated by the first biquad filter stage, and a value generated by the subsequent biquad filter stage in response to a "j−1"th one of the input samples, and a value generated by the subsequent biquad filter stage in response to a "j−2"th one of the input samples.

4. The encoder of claim 1, wherein the subsequent biquad filter stage is configured to generate an output value corresponding to each of the input samples in response to a different subset of the buffered values retrieved from the memory, each said subset includes at least three of the intermediate values generated in the first biquad filter stage and retrieved from the memory after residing in said memory for different latency times.

5. The encoder of claim 1, wherein said encoder is a processor including at least one single instruction, multiple data unit programmed to implement the multistage filter.

6. The encoder of claim 1, wherein said encoder is a processor including multiple arithmetic logic units programmed to implement the biquad filter stages.

7. The encoder of claim 1, wherein said encoder is a processor including multiple arithmetic manipulation units programmed to implement the biquad filter stages.

8. A method for encoding audio data to generate encoded audio data, including by performing multistage filtering on a block of N audio data samples, wherein the multistage filtering includes the steps of:
    (a) performing a first biquadratic filtering operation on the block of N samples to generate intermediate values, and asserting the intermediate values to a buffer memory, wherein the intermediate values include a filtered version of each of at least a subset of the N samples; and
    (b) performing a second biquadratic filtering operation on buffered values retrieved from the memory, to generate a block of output values, wherein the output values include an output value corresponding to each of the samples in the block of N samples, a different subset of the buffered values is retrieved and filtered to generate the output value corresponding to each of the samples in the block, and each said subset of the buffered values includes at least two of the intermediate values generated during performance of step (a) which are retrieved from the memory after residing in said memory for different latency times,
    wherein steps (a) and (b) are performed in response to a single stream of instructions, such that steps (a) and (b) are performed independently and in parallel in response to the single stream of instructions, wherein step (a) includes performance of a multiplication on at least one of the samples in a step of a processing loop determined by the instructions, and step (b) includes performance of a multiplication on at least one of the intermediate values in said step of the processing loop;

wherein the multistage filter is configured to perform multistage filtering of the block of N input samples in a single processing loop with iteration over a sample index but without iteration over a biquadratic filter stage index.

9. The method of claim 8, wherein the multistage filtering is performed in a multistage filter having M stages, the buffered values retrieved in step (b) to generate the output value corresponding to a "j"th one of the samples, where j is an index in the range from M−1 to N−1, include the filtered version of the "j"th one of the samples generated in step (a), the filtered version of a "j−1"th one of the samples generated in step (a), and the filtered version of a "j−2"th one of the samples generated in step (a).

10. A method for processing an encoded bitstream, comprising:

receiving the encoded bitstream and extracting therefrom encoded data representing one or more channels of audio information processed by a multistage filter; and decoding the encoded data to provide decoded representations of the one or more channels of audio information processed by the multistage filter, wherein the multistage filter is operative to perform independently and in parallel, in response to a single stream of instructions:

(a) a first biquadratic filtering operation on a block of N samples to generate intermediate values to assert to a buffer memory, wherein the intermediate values include a filtered version of each of at least a subset of the N samples; and (b) a second biquadratic filtering operation on buffered values retrieved from the memory to generate a block of output values, wherein the output values include an output value corresponding to each of the samples in the block of N samples, a different subset of the buffered values is retrieved and filtered to generate the output value corresponding to each of the samples in the block, and each said subset of the buffered values includes at least two of the intermediate values generated during performance of step (a) which are retrieved from the memory after residing in said memory for different latency times, wherein the first biquadratic filtering operation includes performance of a multiplication on at least one of the samples in a step of a processing loop determined by the instructions, and the second biquadratic filtering operation includes performance of a multiplication on at least one of the intermediate values in said step of the processing loop;

wherein the multistage filter is configured to perform multistage filtering of the block of N input samples in a single processing loop with iteration over a sample index but without iteration over a biquadratic filter stage index.

11. The method of claim 10, wherein the multistage filter is a three-stage biquad filter for performing bandwidth limiting low-pass filtering.

12. The method of claim 10, wherein one of the one or more channels is a LFE channel and the multistage filter is a four-stage biquad filter for performing low pass filtering on the LFE channel.

13. An apparatus for processing an encoded bitstream, comprising:

an input coupled to receive the encoded bitstream; and a decoder coupled to the input, and configured to extract, from the encoded bitstream, encoded data representing one or more channels of audio information processed by a multistage filter, and to decode the encoded data to provide decoded representations of the one or more channels of audio information processed by the multistage filter, wherein the multistage filter is operative to perform independently and in parallel, in response to a single stream of instructions:

(a) a first biquadratic filtering operation on a block of N samples to generate intermediate values to assert to a buffer memory, wherein the intermediate values include a filtered version of each of at least a subset of the N samples; and (b) a second biquadratic filtering operation on buffered values retrieved from the memory to generate a block of output values, wherein the output values include an output value corresponding to each of the samples in the block of N samples, a different subset of the buffered values is retrieved and filtered to generate the output value corresponding to each of the samples in the block, and each said subset of the buffered values includes at least two of the intermediate values generated during performance of step (a) which are retrieved from the memory after residing in said memory for different latency times, wherein the first biquadratic filtering operation includes performance of a multiplication on at least one of the samples in a step of a processing loop determined by the instructions, and the second biquadratic filtering operation includes performance of a multiplication on at least one of the intermediate values in said step of the processing loop;

wherein the multistage filter is configured to perform multistage filtering of the block of N input samples in a single processing loop with iteration over a sample index but without iteration over a biquadratic filter stage index.

14. The apparatus of claim 13, wherein the multistage filter is a three-stage biquadratic filter for performing bandwidth limiting low-pass filtering.

15. The apparatus of claim 13, wherein one of the one or more channels is a LFE channel and the multistage filter is a four-stage biquadratic filter for performing low pass filtering on the LFE channel.

* * * * *